(12) United States Patent
Nakada et al.

(10) Patent No.: US 10,573,798 B2
(45) Date of Patent: Feb. 25, 2020

(54) THERMOELECTRIC CONVERSION MODULE AND THERMOELECTRIC CONVERSION DEVICE

(71) Applicant: MITSUBISHI MATERIALS CORPORATION, Tokyo (JP)

(72) Inventors: Yoshinobu Nakada, Saitama (JP); Toshiyuki Nagase, Naka (JP); Masahito Komasaki, Saitama (JP); Yoshiyuki Nagatomo, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 15/759,658

(22) PCT Filed: Sep. 26, 2016

(86) PCT No.: PCT/JP2016/078237
§ 371 (c)(1),
(2) Date: Mar. 13, 2018

(87) PCT Pub. No.: WO2017/057259
PCT Pub. Date: Apr. 6, 2017

(65) Prior Publication Data
US 2019/0044042 A1 Feb. 7, 2019

(30) Foreign Application Priority Data
Sep. 14, 2016 (JP) .................................. 2016-179109

(51) Int. Cl.
*H01L 35/10* (2006.01)
*H01L 35/32* (2006.01)
(Continued)

(52) U.S. Cl.
CPC .............. *H01L 35/10* (2013.01); *H01L 35/08* (2013.01); *H01L 35/30* (2013.01); *H01L 35/32* (2013.01); *H01L 35/22* (2013.01)

(58) Field of Classification Search
CPC ......... H01L 35/10; H01L 35/22; H01L 35/30; H01L 35/32; H01L 35/08
See application file for complete search history.

(56) References Cited

U.S. PATENT DOCUMENTS 3,859,143 A * 1/1975 Krebs ..................... H01L 35/08
136/205
4,802,929 A * 2/1989 Schock ................... H01L 35/30
136/202
(Continued)

FOREIGN PATENT DOCUMENTS

JP H06342940 A 12/1994
JP 2006-89847 A 4/2006
(Continued)

OTHER PUBLICATIONS

International Search Report dated Nov. 22, 2016, issued for PCT/JP2016/078237.
(Continued)

*Primary Examiner* — Golam Mowla
(74) *Attorney, Agent, or Firm* — Locke Lord LLP; James E. Armstrong, IV; Nicholas J. DiCeglie, Jr.

(57) ABSTRACT

A thermoelectric conversion module in which a plurality of P-type thermoelectric conversion elements and N-type thermoelectric conversion elements, which are combined in pairs, are connected in series between a pair of opposing wiring substrates via the wiring substrates: electrode parts to which the thermoelectric conversion elements are connected, are formed on surfaces of ceramic substrates of the wiring substrates: among the thermoelectric conversion elements, the thermoelectric conversion element having a
(Continued)

larger thermal expansion coefficient has the length, in a direction in which the wiring substrates face each other, that is smaller than the length, in a direction in which the wiring substrates face each other, of the thermoelectric conversion element having a smaller thermal expansion coefficient: an electrically conductive spacer is interposed between at least one of the two ends of the thermoelectric conversion element having a larger thermal expansion coefficient and the ceramic substrate of the wiring substrate.

6 Claims, 6 Drawing Sheets

(51) Int. Cl.
  *H01L 35/08* (2006.01)
  *H01L 35/30* (2006.01)
  *H01L 35/22* (2006.01)

(56) References Cited

U.S. PATENT DOCUMENTS

| | | | | |
|---|---|---|---|---|
| 5,824,561 A | * | 10/1998 | Kishi | H01L 35/32 |
| | | | | 438/55 |
| 2004/0042181 A1 | * | 3/2004 | Nagasaki | H01L 35/08 |
| | | | | 361/725 |
| 2006/0118160 A1 | * | 6/2006 | Funahashi | H01L 35/08 |
| | | | | 136/236.1 |
| 2007/0034245 A1 | | 2/2007 | Nakajima | |
| 2009/0151321 A1 | * | 6/2009 | Jarmon | B64C 1/38 |
| | | | | 60/266 |
| 2010/0218796 A1 | | 9/2010 | Hiroyama | |
| 2010/0307551 A1 | | 12/2010 | Ravi et al. | |
| 2011/0099991 A1 | * | 5/2011 | Stefan | H01L 35/08 |
| | | | | 60/320 |
| 2012/0305304 A1 | | 12/2012 | Kato et al. | |
| 2013/0146116 A1 | | 6/2013 | Jovovic et al. | |
| 2013/0269744 A1 | * | 10/2013 | Maeshima | H01L 35/32 |
| | | | | 136/212 |
| 2014/0102500 A1 | * | 4/2014 | Fujiwara | H01L 35/08 |
| | | | | 136/205 |

FOREIGN PATENT DOCUMENTS

| | | |
|---|---|---|
| JP | 2007-109942 A | 4/2007 |
| JP | 2008-177356 A | 7/2008 |
| JP | 2009-099686 A | 5/2009 |
| JP | 2013-12571 A | 1/2013 |
| JP | 2013-48294 A | 3/2013 |
| JP | 2013-157348 A | 8/2013 |
| JP | 2015-502043 A | 1/2015 |
| JP | 2016-174114 A | 9/2016 |
| WO | 2013/145843 A1 | 10/2013 |

OTHER PUBLICATIONS

Extended European Search Report issued in corresponding European Patent Application No. EP 16851430.5, dated Mar. 18, 2019.

* cited by examiner

THERMOELECTRIC CONVERSION MODULE AND THERMOELECTRIC CONVERSION DEVICE

BACKGROUND OF THE INVENTION

Field of the Invention

The present invention relates to a thermoelectric conversion module in which a plurality of P-type thermoelectric conversion elements and N-type thermoelectric conversion elements are combined and arranged and a thermoelectric conversion device using the thermoelectric conversion module.

Priority is claimed on Japanese Patent Applications No. 2015-190273 filed Sep. 28, 2015 and No. 2016-179109 filed Sep. 14, 2016, the content of which is incorporated herein by reference.

Description of the Related Art

A thermoelectric conversion module has a structure in which a plurality of combinations in which a pair of a P-type thermoelectric conversion element and an N-type thermoelectric conversion element are connected with each other at electrodes are electrically connected in series by arranging them in alternate order of P, N, P, N between a pair of wiring substrates. In such thermoelectric conversion module, when both the ends are connected to DC power source and direct current flows therein, heat is moved in each thermoelectric conversion element by a Peltier effect (the heat is moved in the same direction with the current in the P-type element, and in the opposite direction to the current in the N-type element).

Alternatively, by arranging the thermoelectric conversion module in a state in which one of the wiring substrates is at a higher-temperature side and the other is at a lower-temperature side so as to apply difference in temperature between the wiring substrates, electromotive force is generated in each thermoelectric conversion element by a Seebeck effect and electric current flows. Accordingly, the thermoelectric conversion module can be used for cooling, heating, or generating electric power.

Thermoelectric conversion performance of the P-type and N-type thermoelectric conversion elements is shown by a dimensionless performance index called ZT, which gives a standard for selecting elements. However, even though the elements are made from the same mother material and under the same usage-environment temperature, there are many cases in which the P-type and N-type elements do not always show a same thermoelectric conversion performance; accordingly, the elements need to be adjusted.

For example, Patent Document 1 describes to form elements, generally having square pillar shape with a square cross-sectional shape, into a rectangular cross-sectional shape; and to form the elements into different shapes in accordance with each carrier density of the P-type and N-type elements.

Patent Document 2 describes, when soldering a thermoelectric conversion element onto a warped substrate, to alter thicknesses of solder layers in accordance with a distance between the substrate and the thermoelectric conversion element.

In order to obtain thermoelectric conversion performance (ZT) nearly to each other for the P-type and N-type thermoelectric conversion elements under the same usage temperature environment, it may be considered to select the P-type and N-type thermoelectric conversion elements made of different mother material. However, since strengths of crystal of elements and thermal expansion coefficients are different between different materials, damage to an element having lower strength is larger, i.e., the element having lower strength is broken ahead.

Accordingly, Patent Document 3 suggests a thermoelectric conversion module in which a stress-relaxation layer made of Cr—Cu alloy is formed between a thermoelectric conversion element and an electrode.

However, even though the stress-relaxation layer made of Cr—Cu alloy is used, it is not sufficient to prevent cracks and the like in the thermoelectric conversion element.

PRIOR ART DOCUMENTS

Patent Documents

Patent Document 1: Japanese Unexamined Patent Application, First Publication No. 2013-12571
Patent Document 2: Japanese Unexamined Patent Application, First Publication No. 2013-157348
Patent Document 3: International Publication No. WO 2013/145843

SUMMARY OF THE INVENTION

Problems to be Solved by the Invention

The present invention is achieved in consideration of the above circumstances, and has an object to provide a thermoelectric conversion module having stable thermoelectric conversion performance by preventing cracks and the like of thermoelectric conversion elements and enabling to use thermoelectric conversion elements made of different material.

Means for Solving the Problem

A thermoelectric conversion module according to the present invention includes a pair of opposing wiring substrates and thermoelectric conversion elements connected between the wiring substrates by the wiring substrate. A ceramic substrate and an electrode part formed on a surface of the ceramic substrate and connected to the thermoelectric conversion elements are provided at each of the wiring substrate. Each of the thermoelectric conversion elements is composed from a first thermoelectric conversion element with a larger thermal expansion coefficient and a second thermoelectric conversion element with a smaller thermal expansion coefficient. A length of the first thermoelectric conversion element along a facing direction of the wiring substrates is smaller than a length of the second thermoelectric conversion element along the facing direction of the wiring substrates. In this thermoelectric conversion module, an electrically conductive spacer is interposed between at least one of ends of the first thermoelectric conversion element and the ceramic substrate of the wiring substrates.

In a case in which the thermal expansion coefficients are different to each other between the thermoelectric conversion elements, if the lengths of these are the same, owing to the difference in a thermal expansion amount, there is a case in which the thermoelectric conversion element with the smaller thermal expansion coefficient may be separated from the wiring substrate or a case in which cracks may be generated in the thermoelectric conversion element. In a case in which the thermoelectric conversion element is separated or a case in which the cracks are generated in the thermoelectric conversion element, there may be trouble that current does not flow, the module cannot perform by a large fall of electric conductivity: or even the module is not inoperative, electric power generation is largely lowered.

In the present invention, stress generated in the module by the thermal expansion difference between the thermoelectric conversion elements can be reduced because the thermoelectric conversion element with the higher thermal expansion coefficient is shorter than the thermoelectric conversion element with the lower thermal expansion coefficient: and the electric conductivity can be maintained because the electrically conductive spacer is arranged between the thermoelectric conversion element with higher expansion coefficient and the wiring substrate, with absorbing dimensional change of a gap along with thermal expansion.

Accordingly, there are many options of material, for example, the P-type thermoelectric conversion element and the N-type thermoelectric conversion element can be made from different materials, so that it is possible to obtain a thermoelectric conversion module having stable performance by making the thermoelectric conversion elements have even performance.

In the thermoelectric conversion module according to the present invention, it is preferable to set a difference between the lengths of the first thermoelectric conversion element and the second thermoelectric conversion element be larger than a thermal expansion difference between the first and second thermoelectric conversion elements in a highest temperature in an usage environment.

The difference of the lengths between the thermoelectric conversion element with the higher thermal expansion coefficient and the thermoelectric conversion element with the lower thermal expansion coefficient can be set in accordance with the thermal expansion difference between the thermoelectric conversion element at the highest temperature in the usage environment. It is easy to design by setting the difference to be larger than the thermal expansion difference, because the thermal expansion difference between them is slight.

Specifically, it is desirable that the difference of the lengths be not smaller than 30 μm and not larger than 500 μm. If it is smaller than 30 μm, unevenness or undulation of an end surface of the thermoelectric conversion element is larger than the difference between the thermal expansion coefficients when these are made at low cost, so there may be a problem that power generation performance is deteriorated. If it is larger than 500 μm, the electrically conductive spacer needs to be thicker and it is necessary to use a more expensive electrically conductive spacer in order to maintain thermal conductivity and the electric conductivity between the wiring substrate and the thermoelectric conversion elements, so the cost is increased.

In the thermoelectric conversion module according to the present invention, the electrically conductive spacer is made of either one of a bound body of resin powder coated with metal; a bound body of inorganic powder coated with metal; electrically conductive resin; graphite; porous metal; a structure body of carbon nanofiber; graphene; and a foil or a plate made of aluminum of purity higher than 99.99 mass % (4N—Al).

In this case, it is acceptable that the electrically conductive spacer is arranged in each of spaces between two ends of the first thermoelectric conversion element and the wiring substrate: the electrically conductive spacer between the first thermoelectric conversion element and the wiring substrate which is a lower-temperature side in usage among the two wiring substrates is made of the bound body of resin powder coated with metal or the conductive resin: the electrically conductive spacer between the first thermoelectric conversion element and the wiring substrate which is a higher-temperature side in usage is made of either one of the bound body of inorganic powder coated with metal, the graphite, the porous metal, the structure body of carbon nanofiber, the graphene, and the foil or the plate made of aluminum of purity higher than 99.99 mass % (4N—Al).

The electrically conductive spacer made of base material of resin is used on the lower-temperature side; and the electrically conductive spacer made of base material of metal, carbon and the like is used on the higher-temperature side, so heat resistance property can be shown in accordance with an usage thermal environment.

It is acceptable that a heat transfer layer made of aluminum of purity higher than 99.99 mass % is formed on a counter surface to a surface in which the electrode part is provided in the ceramic substrate of the wiring substrate.

A thermoelectric conversion module with heat sink can be provided with the thermoelectric conversion module, an endothermic heat sink joined on the heat transfer layer of the one wiring substrate, and a radiation heat sink joined on the heat transfer layer of the other wiring substrate. Further, a thermoelectric conversion device can be provided with the thermoelectric conversion module with heat sink and a liquid cooling cooler fixed to the radiation heat sink.

Effects of the Invention

According to the present invention, it is possible to prevent the thermoelectric conversion elements from cracking and separation from the wiring substrate, so there are many options of material, for example, coupling the P-type and the N-type thermoelectric conversion elements made from the different materials, and it is possible to obtain a thermoelectric conversion module having stable performance by making the thermoelectric conversion elements have even performance.

DETAILED DESCRIPTION OF THE INVENTION

Below, embodiments of the present invention will be explained referring drawings.

Figure 1:
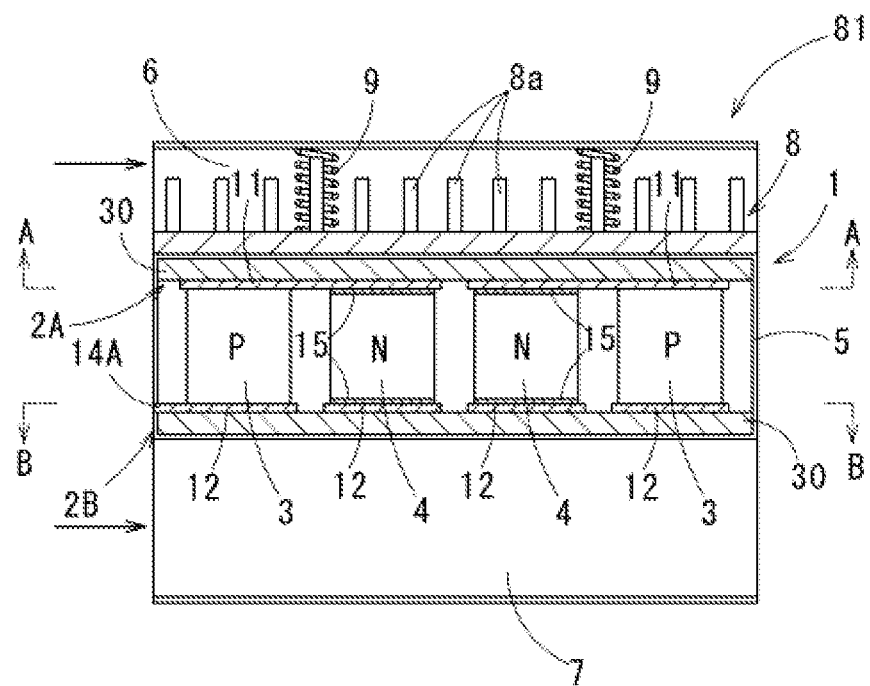
FIG. 1 It is a vertical sectional view showing an example of a thermoelectric conversion device structured by arranging a thermoelectric conversion module according to a first embodiment of the present invention between a higher-temperature fluid and a lower-temperature fluid.
Figure 2:
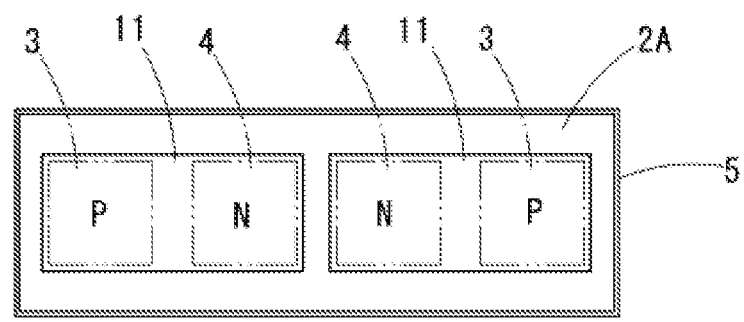
FIG. 2 It is a plan sectional view along the line A-A in FIG. 1.
Figure 3:
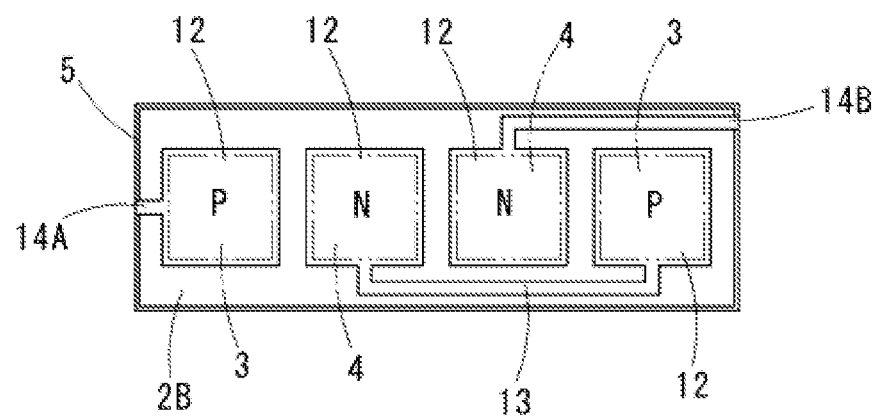
FIG. 3 It is a plan sectional view along the line B-B in FIG. 1.

First, a first embodiment of a thermoelectric conversion module and a thermoelectric conversion device will be described. The thermoelectric conversion module 1 of the first embodiment is, as shown in FIGS. 1 to 3, structured by arranging P-type thermoelectric conversion elements 3 and N-type thermoelectric conversion elements 4 linearly (one-dimensionally) between a pair of opposing wiring substrates 2A and 2B. FIGS. 1 to 3 simply show an example of two pairs of the P-type thermoelectric conversion element 3/the N-type thermoelectric conversion element 4 are arranged: in this case, four thermoelectric conversion elements 3 and 4 in total are arranged in line. In the drawings, the P-type thermoelectric conversion elements 3 are denoted by "P"; and the N-type thermoelectric conversion elements 4 are denoted by "N". The thermoelectric conversion module 1 is arranged entirely in a case 5 and attached between a high temperature fluid channel 6 in which high temperature gas flows and a low temperature fluid channel 7 in which cooling water flows, so as to structure a thermoelectric conversion device 81.

The wiring substrates 2A and 2B have electrode parts stated below and the like formed on an insulation ceramic substrate 30 having high property of heat transfer made of aluminum nitride (AlN), alumina ($Al_2O_3$), silicon nitride ($Si_3N_4$), silicon carbide (SiC), a carbon plate, a diamond thin film substrate deposited on a graphite plate or the like.

Silicide based material, oxide based material, skutterudite (intermetallic compound of transition metals and pnictogens), half-Heusler and the like can be used as material of the P-type thermoelectric conversion elements 3 and the N-type thermoelectric conversion elements 4: for example, combinations shown in Table 1 can be used.

TABLE 1

| Element Type | Sample | |
|---|---|---|
| Silicide | $MnSi_{1.73}$ | P-type |
| | $Mg_2Si$ (Sb doped) | N-type |
| Oxide | $Na_{0.75}CoO_2$ | P-type |
| | $Ca_{0.9}La_{0.1}MnO_3$ | N-type |
| Oxide | $Na_{0.75}CoO_3$ | P-type |
| | $Ca_{0.9}La_{0.1}MnO_4$ | N-type |
| Skutterudite | $CoSb_3$ | P-type |
| | $CoSb_3$ (2 at % Mn doped) | N-type |
| Half-Heusler | $TiZr_{0.5}Hf_{0.5}CoSn_{0.2}Sb_{0.8}$ | P-type |
| | $Ti_{0.5}Zr_{0.25}Hf_{0.25}NiSn_{0.994}Sb_{0.006}$ | N-type |

Among these samples, silicide based material has small influence on environment, is rich in reserves, and thus notable. The present embodiment will be explained with silicide based material.

Manganese silicide ($MnSi_{1.73}$) and magnesium silicide ($Mg_2Si$) which are silicide based material are made into the thermoelectric conversion elements 3 and 4 by steps of making respective mother alloys, milling them by a ball mill into powder having particle diameter smaller than 75 μm for example, making bulk material having a disk-shape or a square plate-shape or the like by plasma discharge sintering, hot press and a hot isostatic pressing, and cutting them into a square-shaped pillar for example. On each of end surfaces of the thermoelectric conversion elements 3 and 4, metallize layers (not illustrated) including a layer of one of nickel, copper, silver, gold, cobalt, molybdenum, titan are formed by plating or spattering. In a case in which the metallized layers are made of silver or gold, it is desirable to form the metallized layer interposing a barrier layer (not illustrated) made of a single layer or a multi-layer made of one of nickel or titan.

Between a pair of the wiring plates 2A and 2B made of ceramic substrates, the P-type thermoelectric conversion elements 3 made from manganese silicide and the N-type thermoelectric conversion elements 4 made from magnesium silicide are aligned and connected. In this case, manganese silicide (the P-type thermoelectric conversion elements 3) and magnesium silicide (the N-type thermoelectric conversion elements 4) are different in compressive strength. The compressive strength of manganese silicide is 2300 MPa at room temperature (1200 MPa at 500° C.), for example. The compressive strength of magnesium silicide is 1000 MPa at room temperature (260 MPa at 500° C.), for example. Therefore, in the first embodiment in which the thermoelectric conversion elements 3 and 4 are aligned in line, the P-type thermoelectric conversion elements 3 having higher strength among the thermoelectric conversion elements 3 and 4 are arranged at both the ends of the row, and the elements are aligned from one end (the left end in FIG. 1) in order of the P-type thermoelectric conversion element 3, the N-type thermoelectric conversion element 4, the N-type thermoelectric conversion element 4, the P-type thermoelectric conversion element 3 between the wiring substrates 2A and 2B.

These thermoelectric conversion elements 3 and 4 are formed into square pillars or the like in which cross section thereof is four-sided (e.g., 1 mm to 8 mm on a side); and length thereof (along a direction in which the wiring substrates 2A and 2B face each other) may be set to be not smaller than 2 mm and not larger than 10 mm. Since thermal expansion coefficients are different between manganese silicide forming the P-type thermoelectric conversion elements 3 and magnesium silicide forming the N-type thermoelectric conversion elements 4, the lengths of the thermoelectric conversion elements 3 and 4 (along the direction in which the wiring substrates 2A and 2B face each other) are set so that the length of the N-type thermoelectric conversion elements (i.e., the first thermoelectric conversion elements in the present invention) 4 with the a larger thermal expansion coefficient is shorter than the length of the P-type thermoelectric conversion elements (the second thermoelectric conversion elements in the present invention) 3.

In the present embodiment, the lengths of the P-type thermoelectric conversion elements 3 and the N-type thermoelectric conversion elements 4 are set to about 6 mm though, the lengths are set to have slight difference in accordance with the difference of the thermal expansion coefficients between the thermoelectric conversion elements 3 and 4 and usage environment temperature. For example, where the thermal expansion coefficient of manganese silicide (the P-type thermoelectric conversion elements 3) is $10.8 \times 10^{-6}$/K and the thermal expansion coefficient of magnesium silicide (the N-type thermoelectric conversion elements 4) is $12.5 \times 10^{-6}$/K to $17.0 \times 10^{-6}$/K; and if highest temperature in the usage environment is 500° C., the thermal expansion difference between the thermoelectric conversion elements 3 and 4 is 4.9 μm to 18.0 μm. This difference is very small, so in order to design easily, the specific lengths of the thermoelectric conversion elements 3 and 4 are decided to have a difference larger than this thermal expansion difference, e.g., in a range of 30 μm to 500 μm. Alternatively, the length of the N-type thermoelectric conversion elements 4 having the larger thermal expansion coefficient may be set in a range of 0.917 times to 0.995 times as long as the length of the P-type thermoelectric conversion elements 3.

However, it is not prohibited to design the thermoelectric conversion elements 3 and 4 to have the same difference as he thermal expansion difference at the highest temperature in the usage environment (in the above case of manganese silicide and magnesium silicide, 4.9 µm to 18.0 µm) so that the thermoelectric conversion elements 3 and 4 have substantially the same lengths under the highest temperature in the usage environment.

On one wiring substrate, i.e., on the first wiring substrate 2A in an upper part of FIG. 1, two electrode parts 11 having a four-sided shape in a plan view are formed to connect the adjacent P-type thermoelectric conversion element 3 and the N-type thermoelectric conversion element 4 in respective pairs thereof, as shown in FIG. 2. On the other wiring substrate, i.e., on the second wiring substrate 2B in a lower part of FIG. 1, four electrode parts 12 having a square shape in a plan view, an inner wiring part 13, and outer wiring parts 14A and 14B are formed, as shown in FIG. 3. The four electrode parts 12 are connected to the respective thermoelectric conversion elements 3 and 4. Among the thermoelectric conversion elements 3 and 4 of respective pairs connected to each other by the electrode parts 11 of the first wiring substrate 2A, the N-type thermoelectric conversion element 4 of one pair and the P-type thermoelectric conversion element 3 of the other pair is connected by the inner wiring part 13. The P-type thermoelectric conversion element 3 of the one pair and the N-type thermoelectric conversion element 4 of the other pair is connected to the outside by the outer wiring parts 14A and 14B respectively. As described above, the electrode parts 11 and 12, the inner wiring part 13, and the outer wiring parts 14A and 14B are formed, so that the thermoelectric conversion elements 3 and 4 are connected in series between the wiring substrates 2A and 2B.

The electrode parts 11 and 12 are formed by fixing copper, aluminum, molybdenum or a laminate plate of these material on a surface of the respective ceramic substrates 30. Size of the respective electrode parts 11 and 12 is set in accordance with size of the thermoelectric conversion elements 3 and 4. For example, with respect to the thermoelectric conversion elements 3 and 4 with sectional dimensions of 4 by 4 mm, the electrode parts 11 are formed to have rectangular shape with dimensions 5 mm×10 mm; and the electrode parts 12 are formed to have a square shape with dimensions 4.5 mm square. Thickness of the electrode parts 11 and 12 may be in a range of 0.05 mm to 2.0 mm; 0.3 mm thickness is preferable. The ceramic substrates 30 of the wiring substrates 2A and 2B are formed to have a flat-shape which can make space with 2 mm or larger width between the electrode parts 11 and 12 and around them. Thickness of the ceramic substrates 30 may be, for example, in a range of 0.1 mm to 1.5 mm when it is made of aluminum nitride or alumina; or in a range of 0.05 mm to 1.5 mm when it is made of silicon nitride. As a preferable example, the ceramic substrates 30 may be made by using a ceramic plate made of aluminum nitride, and formed to have dimensions 30 mm×12.5 mm and thickness 0.6 mm.

The wiring parts 13, 14A and 14B are formed from wire material made of copper, aluminum, gold, or silver for example; and joined on the surfaces of the ceramic substrates 30, similarly to the electrode parts 11 and 12. Width thereof is in a range of 0.3 mm to 2.0 mm; and thickness thereof may be in a range of 0.05 mm to 4.0 mm.

As shown in FIG. 1, in space between the N-type thermoelectric conversion elements 4 having the shorter length and the electrode parts 11 of the first wiring substrate 2A and in space between the N-type thermoelectric conversion elements 4 and the electrode parts 12 of the second wiring substrate 2B, electrically conductive spacers 15 are provided so as to be filled into the space. The electrically conductive spacers 15 are formed into a sheet shape made from a laminate of one of or two or more of a bound body of resin powder coated with metal, a bound body of inorganic powder coated with metal, electrically conductive resin, graphite, porous metal, a structure body of carbon nanofiber, graphene, and a foil or plate made of aluminum with purity 99.99 mass % or higher (4N—Al).

The resin powder coated with metal is powder (coated resin powder) in which resin powder such as acrylic resin is coated with metal such as silver, gold, aluminum, copper and the like by electroless deposition, spattering method or the like. It is preferable to use coated resin powder with particle diameter of the resin powder 2 µm to 10 µm, and coating amount of metal 40 mass % to 90 mass %. The electrically conductive spacers 15 can be made by dispersing the coated resin powder into solvent such as water so as to be paste, applying the paste and drying it.

In this case, as the resin powder coated with metal, in view of electric conductivity, it is preferable to use resin powder coated with silver (silver-coating powder). When using silver-coating powder, it is preferable to mix, in a paste in which silver-coating powder is dispersed, a paste in which silver powder (containing silver 30 mass % to 70 mass %) is dispersed with 30 mass % to 70 mass %. In this case, the electrically conductive spacers 15 can be made by applying with apply thickness 25 nm to 500 nm and heating at 100° C. to 180° C. for 10 minutes to 60 minutes.

As inorganic powder, $SiO_2$ powder, ceramic powder, hollow silica powder, hollow ceramic powder, hollow glass powder and the like can be used.

The hollow silica powder includes silica ($SiO_2$) as a main ingredient: it has a mean particle diameter 5 to 120 nm, shell thickness 1 to 35 nm, and number of silanol group (Si—OH group) per unit area 1 to 10/$cm^2$. The hollow silica powder is produced by making powder of core shell particles in which the core is organic polymer and the shell is silica, and then removing the core. The organic polymer particles which becomes the cores (core particles) are particles having a mean particle diameter 5 to 90 nm, produced by soap-free polymerization, copolymerizing polymerizable monomer as a main ingredient with ionic comonomer at mole ratio 150:1 to 2:1. The hollow silica powder is manufactured by steps of adding cationic water-soluble macromolecule and nonionic water-soluble macromolecule into liquid including the core particles, permuting the liquid including the core particles from water to alcohol, coating the core particles with silica by adding alkoxysilane, water, and basic substance, producing powder made of the core shell particles with a mean particle diameter 5 to 120 nm and a silica-shell thickness 1 to 35 nm, and then removing the core.

In addition to the above-described hollow silica powder, Silinax (a registered trademark) made by Nittetsu Mining Co, LTD. can be used as the hollow silica powder, for example. The Silinax (the registered trademark) has a mean particle diameter 80 to 130 nm, and a bulk density 0.03 to 0.07 g/ml.

The hollow silica powder is used in a state in which surfaces are coated with metal such as silver, gold, aluminum, copper and the like by electroless plating, spattering, or the like. A metal coating amount is 40 mass % to 90 mass % of entire particle mass. The electrically conductive spacers 15 can be produced by drying a paste including the hollow silica powder coated with metal (coated hollow silica powder).

In this case, the paste can be obtained by dispersing the hollow silica powder coated with metal (metal coated hollow silica powder) into water at 10 mass % to 25 mass %. At this time, in order to improve dispersion property of the metal coated hollow silica powder, an aqueous dispersant can be added. As the aqueous dispersant, amine, phosphoric acid, carboxylic acid, and citric acid can be used. An addition amount of the aqueous dispersant is preferably 1 mass % to 10 mass % of the entire paste.

It is possible to manufacture the electrically conductive spacers 15 made of the bound body of the coated hollow silica powder by applying the paste with thickness 30 μm to 500 μm and drying it at 100° C. to 180° C. for 10 minutes to 60 minutes.

In a case of hollow silica powder coated with silver for example, silver nano colloid particles can be added to the paste. In this case, it is preferable that a particle diameter be 5 nm to 40 nm, and an addition amount be 0.2 mass % to 1.4 mass % of the entire paste as the silver nano colloid particles. It is possible to make a bound body in which the hollow silica powder coated with silver and silver nano colloid particles are bound by applying this paste on an end surface of a thermoelectric conversion element and heating it. Thus when the bound body is formed by mixing the hollow silica powder having a larger particle diameter coated with silver and the silver nano colloid particles having a smaller particle diameter, so the smaller particles move into space between the larger particles and voidage is reduced: as a result, contact area of the particles is increased and electric resistance is reduced. For example, when mixing 250 gram of hollow silica powder coated with silver having the particle diameter 160 nm and 1 gram silver nano colloid particles having the particle diameter 30 nm, a porosity rate of the bound body is 40% (volume ratio).

Porous metal has many pores: generally a diameter thereof is several micrometers to several centimeters. A metal foam and a metal sponge are included in the porous metal. The metal foam is a metal having many pores and a three-dimensional mesh-like structure, made by using foaming phenomenon of gas, and is also called as a metal foam. The metal foam includes a three-dimensional mesh-like metal skeleton made by coating metal on a surface of a frame of porous resin and then burning out only the resin. The metal sponge is made from metal wire connected in a three-dimension mesh-like structure, and has comparatively a high porosity rate among the porous metal.

The electrically conductive resin is made by dispersing an electrically conductive filler formed into flakes or a spherical shape from Ag, Al, Au, Cu or the like in resin such as silicone resin or the like. The structure body of carbon nanofiber is non-woven fabric of carbon nanofiber formed into a random network shape.

Graphene is a foil of carbon in which a six-membered ring network is spread planar. Graphite is a laminate of several ten layers of a single layer graphene though, there is a case in which it is called graphene for convenience. The electrically conductive spacer is manufactured by applying dispersing liquid in which this graphene is dispersed at 5 mass % in isopropyl alcohol and drying it.

A carbon nanotube is made by rounding graphene into a pipe shape. There are a single-layered structure (in which one layer structures a tube) and a multi-layered structure for this carbon nanotube. Carbon nanofiber is a kind of the multi-layered carbon nanotube, and has a feature of relatively large size in a diameter 100 nm and a length 100 μm. The structure body of carbon nanofiber as the electrically conductive spacer is manufactured by applying liquid in which carbon nanofiber is dispersed at 2 mass % in water and drying it.

Since the thermoelectric conversion elements 3 and 4 are thermally expanded in the usage environment as below-mentioned, in order to prevent the thermoelectric conversion elements 3 and 4 from cracking or separation owing to the thermal expansion, these electrically conductive spacers 15 are required to have deformability (elastic deformability or plastic deformability) in degree of absorbing thermal expansion.

These electrically conductive spacers 15 are joined to the thermoelectric conversion elements and the wiring substrates by brazing joint using silver solder or a silver paste when it is a foil or a plate made of the bound body of resin powder coated with metal, the bound body of inorganic powder coated with metal, porous metal such as the metal foam, the metal sponge and the like, or aluminum with the purity 99.99 mass % or higher (4N—Al). The electrically conductive resin is joined to the thermoelectric conversion elements and the wiring substrates by a bonding agent. The structure body of carbon nanofiber, graphene, graphite are joined to the thermoelectric conversion elements and the wiring substrate by holding them between the thermoelectric conversion elements and the wiring substrates, pressuring mechanically so as to pressure-weld physically. Alternatively, it is joined to the thermoelectric conversion elements and the wiring substrates by applying the silver paste on the thermoelectric conversion elements on which a metallized layer of nickel is made, pressure-welding the carbon nanofiber, graphene, or a carbon sheet before drying, and then drying at 100° C.

As a preferable example of a joining aspect, for example, the electrically conductive spacers 15 provided at a lower-temperature side (a side of the second wiring substrate 2B) is formed by applying a mixed paste of the above-mentioned paste of silver coated powder and the silver paste, and drying it. The electrically conductive spacer 15 provided at a higher-temperature side (a side of the first wiring substrate 2A) is an aluminum foil with thickness 150 μm and purity 99.99 mass % or higher, and joined to the electrode part 11 and the N-type thermoelectric conversion element 4 by the silver solder or the like. In this case, area of the electrically conductive spacer 15 is the same as sectional area of the N-type thermoelectric conversion element 4.

The electrically conductive spacer 15 may have 1 to 1.27 times of the sectional area of the thermoelectric conversion elements 3 and 4.

As described above, the P-type thermoelectric conversion elements 3 are directly joined between the electrode parts 11 and 12 of the wiring substrates 2A and 2B: and the N-type thermoelectric conversion elements 4 are joined between the electrode parts 11 and 12 of the wiring substrates 2A and 2B with interposing the electrically conductive spacers 15; respectively using the bonding agent such as a bond, the silver solder, or a bonding agent by the silver paste, so that the thermoelectric conversion elements 3 and 4 are connected in series between the outer wiring part 14A and 14B. As the bonding agent by the silver paste, a silver paste including silver powder with a particle diameter 0.05 μm to 100 μm, resin and a solvent is used. The thermoelectric conversion elements 3 and 4 are joined between the wiring substrates 2A and 2B while forming a silver fired body by applying the silver paste on the electrode parts 11 and 12 of the wiring substrates 2A and 2B, drying them, sticking the end surfaces on each other (at the metallized layers) of the thermoelectric conversion elements 3 and 4, and heating with pressurizing them so that these are integrated.

Finally, the integrated article in which the thermoelectric conversion elements 3 and 4 are joined between the wiring substrates 2A and 2B is put in the case 5 made from stainless steel or the like in an airtight state, so that the thermoelectric conversion module 1 is manufactured by maintaining a vacuum or decompression state of the interior and packaging it. In addition, the case 5 is not always necessary; there is no need to provide the case 5.

In this packaging process, compressive load is act on the thermoelectric conversion elements 3 and 4. In this embodiment, since the P-type thermoelectric conversion elements 3 having the higher strength are arranged at both the end of a row so that the thermoelectric conversion elements 3 having the higher strength support the load at both the end positions of the arrangement; the load on the thermoelectric conversion elements 4 having the lower strength is reduced: accordingly, it is possible to prevent cracking and the like. In addition, the outer wiring parts 14A and 14B are drawn out in an insulation state to the case 5.

In the example shown in FIG. 1, the thermoelectric conversion module 1 structured as above is in contact with a higher-temperature channel 6 as an external heat source in which a higher-temperature fluid such as exhaust gas of an internal combustion engine flows as shown by an arrow, at a side of the one wiring substrate 2A (the first wiring substrate) among the wiring substrates 2A and 2B: and is contact with a lower-temperature channel 7 in which cooling water as a heat carrier flows at a side of the other wiring substrate 2B (the second wiring substrate). Accordingly, electromotive force is generated in the thermoelectric conversion elements 3 and 4 in accordance with a temperature difference between the wiring substrates 2A and 2B, so that a potential difference can be obtained between the outer wiring parts 14A and 14B at both the end of the arrangement, corresponding to total of the electromotive force generated in the thermoelectric conversion elements 3 and 4. In addition, in the higher-temperature channel 6, a heat sink (an endothermic heat sink) 8 having rod-like endothermic fins 8a is provided, and elastic members 9 such as springs pressing the endothermic fins toward the first wiring substrate 2A are provided: so the thermoelectric conversion device 81 is structured.

In this usage environment, thermal expansion is different between the thermoelectric conversion elements 3 and 4. However, the length of the N-type thermoelectric conversion elements 4 having the larger thermal expansion coefficient is set to be smaller than the length of the P-type thermoelectric conversion elements 3 in advance, with the difference therebetween is more than difference of the thermal expansion amounts between the thermoelectric conversion elements. Accordingly, even in the usage environment temperature, even though the difference between the lengths of the thermoelectric conversion elements is reduced; the length of the N-type thermoelectric conversion elements 4 is still smaller than the length of the P-type thermoelectric conversion elements 3. Moreover, since the electrically conductive spacers 15 are arranged between these N-type thermoelectric conversion elements 4 and the wiring substrates 2A and 2B, a reduction in the difference as a result of the thermal expansion is absorbed by deformation of the electrically conductive spacers 15. Accordingly, it is possible to prevent the N-type thermoelectric conversion elements 4 having the lower strength from being acted tensile stress on owing to the thermal expansion of the P-type thermoelectric conversion elements 3; and it is possible to prevent the thermoelectric conversion elements 3 and 4 from cracking or being separated from the wiring substrates 2A and 2B.

Figure 4:
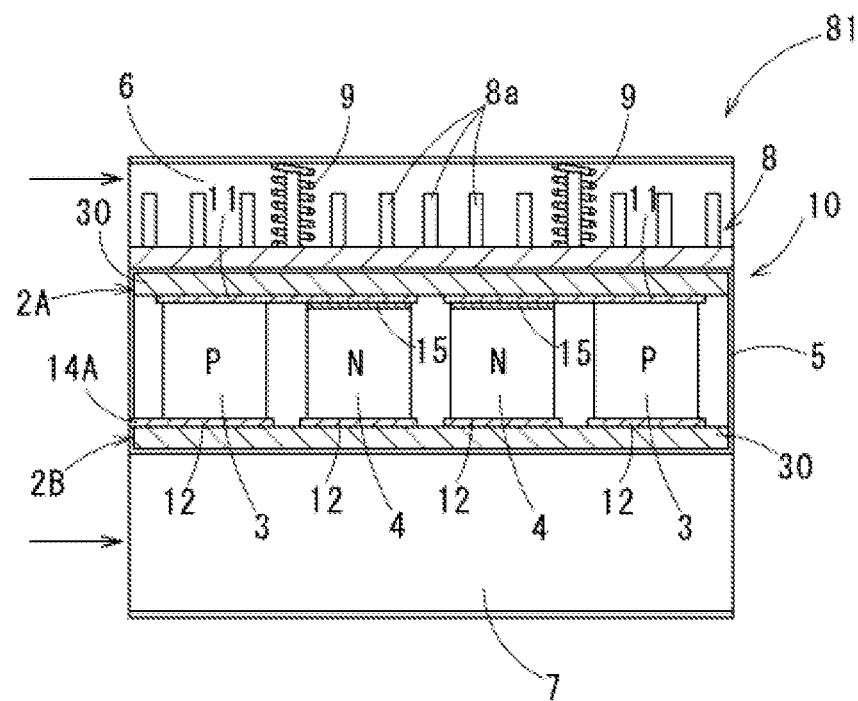
FIG. 4 It is a vertical sectional view showing an example of a thermoelectric conversion device structured by arranging a thermoelectric conversion module according to a second embodiment of the present invention between a higher-temperature fluid and a lower-temperature fluid.
Figure 5:
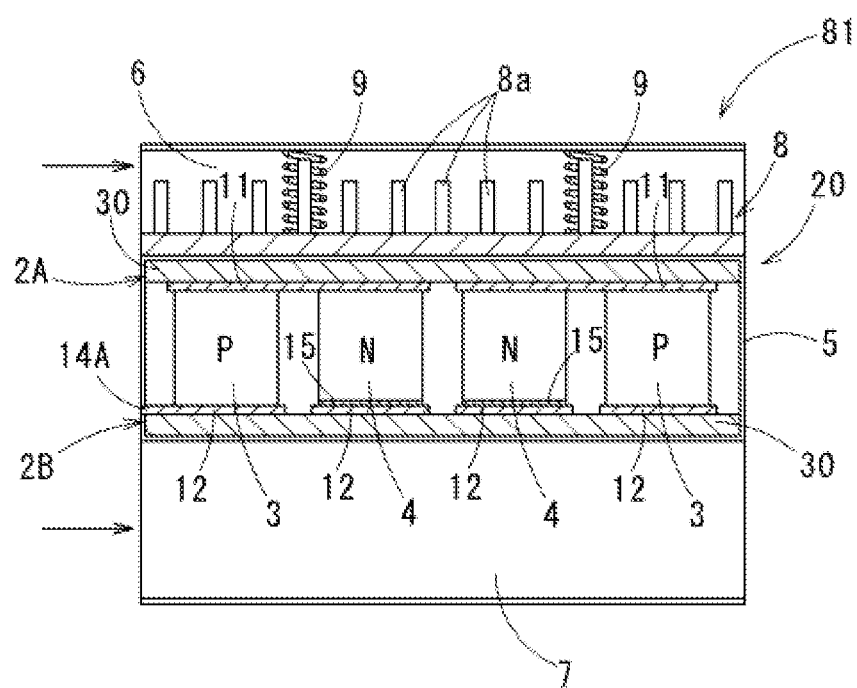
FIG. 5 It is a vertical sectional view showing an example of a thermoelectric conversion device structured by arranging a thermoelectric conversion module according to a third embodiment of the present invention between a higher-temperature fluid and a lower-temperature fluid.

In the first embodiment shown in FIG. 1, the electrically conductive spacers 15 are arranged at both the two parts between both the ends of the thermoelectric conversion elements 4 and the wiring substrate 2A and 2B respectively. Alternatively, the electrically conductive spacers 15 may be arranged alone between one end of the thermoelectric conversion elements 4 and the first wiring substrate 2A as a thermoelectric conversion module 10 of a second embodiment shown in FIG. 4: or as in a thermoelectric conversion module 20 of a third embodiment shown in FIG. 5, the electrically conductive spacers 15 may be arranged alone between the other end of the thermoelectric conversion elements 4 and the second wiring substrate 2B. In FIG. 4 and FIG. 5, the same parts as that of the first embodiment are denoted by the same reference symbols, and the description thereof is omitted so as to simplify. In these embodiments, even though the aspects of the thermoelectric conversion modules are different, the higher-temperature channel 6, the lower-temperature channel 7, the heat sink 8 and the like have the same structure: the thermoelectric conversion devices are denoted by the same reference symbol 81.

As described in these embodiments, it is sufficient that the electrically conductive spacers 15 be arranged at least one of the two parts between both the ends of the thermoelectric conversion elements 4 and the wiring substrates 2A and 2B.

Among the above described electrically conductive spacers 15, there is a difference in the thermal resistance between the electrically conductive spacers which are made by using resin as the base material such as the bound body of resin powder coated with metal, the conductive resin and the like, and the electrically conductive spacers which are made by using metal, carbon or the like as the base material such as the bound body of inorganic powder coated with metal, graphite, the porous metal such as the metal foam, the metal sponge and the like, the structure body of carbon nanofiber, graphene, the foil or the plate made of aluminum with purity 99.99 mass % or higher (4N—Al) and the like. Therefore, it is desirable to use the electrically conductive spacers having the resin base material when the electrically conductive spacers 15 are provided nearer to the lower-temperature channel 7; or use the electrically conductive spacers having the metal or carbon base material when the electrically conductive spacers 15 are provided nearer to the higher-temperature channel 6. When the electrically conductive spacers 15 are provided at both the ends of the thermoelectric conversion elements 4, it is desirable to arrange electrically conductive spacers usable at high temperature on the higher-temperature end and electrically conductive spacers usable at low temperature on the lower-temperature end. In accordance with the usage environment temperature, the electrically conductive spacers may have the same property at both the ends of the thermoelectric conversion elements 4.

Figure 6:
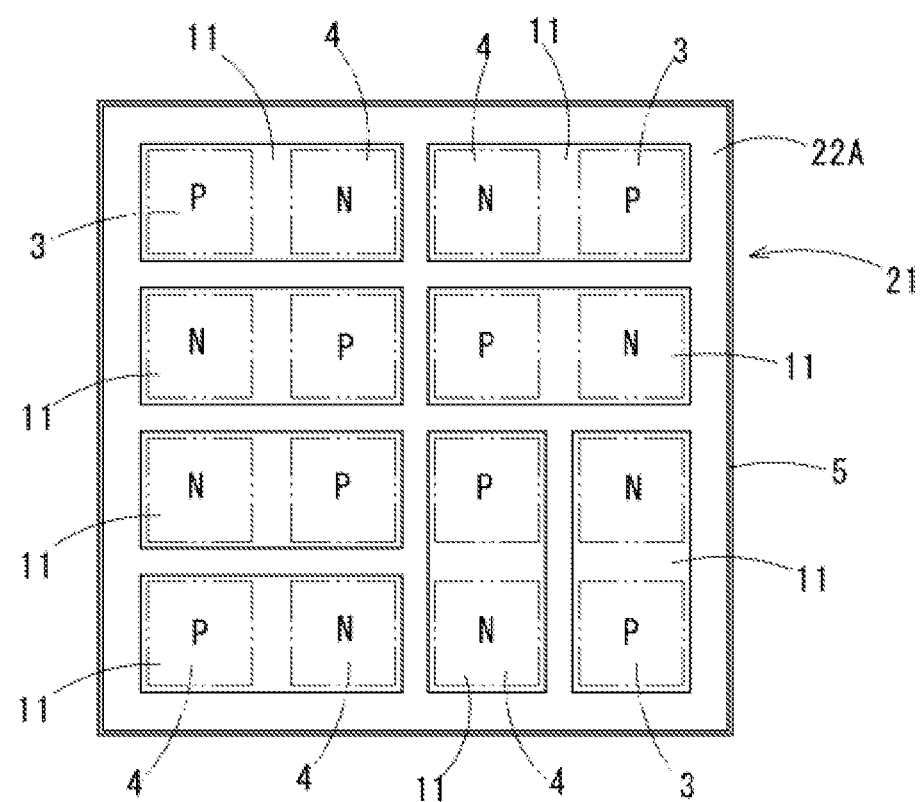
FIG. 6 It is a plan sectional view showing a thermoelectric conversion module according to a fourth embodiment of the present invention, as FIG. 2.
Figure 7:
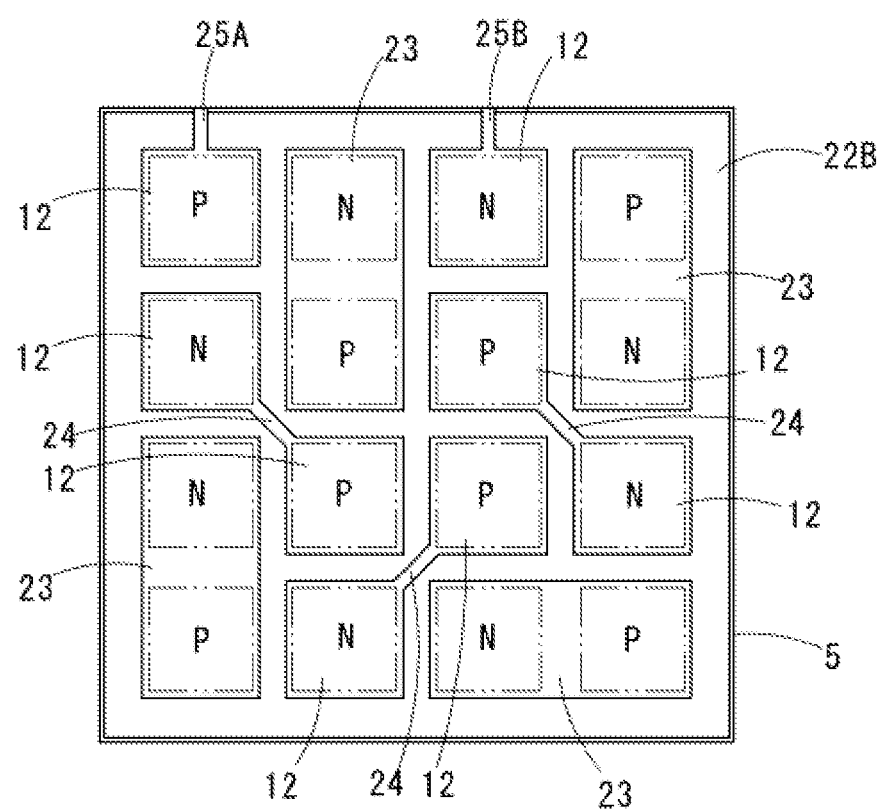
FIG. 7 It is a plan sectional view of the fourth embodiment, as FIG. 3.

FIG. 6 and FIG. 7 show a thermoelectric conversion module 21 of a fourth embodiment in which the P-type thermoelectric conversion elements 3 and the N-type thermoelectric conversion elements 4 are arranged in-plane (in two dimensions). In this fourth embodiment, drawings corresponding to FIG. 1 of the first embodiment are omitted: however, a vertical sectional structure is substantially the same as that of FIG. 1, so it will be explained also referring to FIG. 1 as necessary.

This thermoelectric conversion module 21 has a pair of wiring substrates 22A and 22B; and 8 pairs of the P-type thermoelectric conversion elements 3 and the N-type thermoelectric conversion elements 4 provided between the wiring substrates 22A and 22B, which are arranged in a plane with a square of 4 columns×4 rows. In four corners of the square, the P-type thermoelectric conversion elements 3 having the higher strength are positioned. In the example shown in FIG. 6 and FIG. 7, the P-type thermoelectric conversion elements 3 are arranged also on a center of the square though, it is sufficient to arrange the P-type thermoelectric conversion elements 3 on the four corners; and it is not limited in the arrangement of this drawing regarding the center part.

In the first wiring substrate 22A among the wiring substrates 22A and 22B, as shown in FIG. 6, the electrode parts 11 are formed eight in total, rectangular in plan view, in which the adjacent P-type thermoelectric conversion element 3 and the N-type thermoelectric conversion element 4 are connected to each other in respective pairs. In the second wiring substrate 22B, as shown in FIG. 7, the electrode parts 12 are formed eight, square in plan view, in which the one P-type thermoelectric conversion element 3 or the one N-type thermoelectric conversion element 4 is connected independently: and four electrode parts 23 are formed, rectangular in plan view, in which two elements, i.e., the P-type thermoelectric conversion element 3 and the N-type thermoelectric conversion element 4, in different combination than that in the first wiring substrate 22A, are connected to each other. Furthermore, among the eight electrode parts 12 which are square in plan view, six of the electrode parts 12 are connected by twos each, oblique via an inner wiring part 24. In these six electrode parts 12, the P-type thermoelectric conversion elements 3 and the N-type thermoelectric conversion elements 4 are connected to each other, in different combination than pairs of the thermoelectric conversion elements connected by the electrode parts 11 in the first wiring substrate 22A.

In the remaining two electrode parts 12 which are provided independent in the second wiring substrate 22B, outer wiring parts 25A and 25B are formed to connect the thermoelectric conversion elements 3 and 4 between the wiring substrates 22A and 22B: thereby connecting the thermoelectric conversion elements 3 and 4 in series between the outer wiring parts 25A and 25B.

The wiring substrate 22A and 22B are made into a 30 mm square for example, when the thermoelectric conversion elements 3 and 4 have the same dimensions as that in the first embodiment. Specific connecting aspects such as shapes of the electrode parts, order of connection and the like are not limited to the illustrated example as long as the P-type thermoelectric conversion elements 3 are arranged at the four corners.

The P-type thermoelectric conversion elements 3 and the N-type thermoelectric conversion elements 4 are made of materials as the same as that in the first embodiment. Therefore, the length of the N-type thermoelectric conversion elements (the first thermoelectric conversion elements) 4 is set to be shorter than the length of the P-type thermoelectric conversion elements (the second thermoelectric conversion elements) 3; and the electrically conductive spacers 15 (not illustrated in FIG. 6 and FIG. 7, refer to FIG. 1) are provided between the N-type thermoelectric conversion elements 4 and the electrode parts 11 so as to fill a gap therebetween as in a case in the first embodiment. Needless to say, as shown in FIG. 4 and FIG. 5, the electrically conductive spacers 15 may be arranged between the N-type thermoelectric conversion elements 4 and the other electrode parts 12; or the electrically conductive spacers 15 may be arranged between both the ends of the N-type thermoelectric conversion elements 4 and the electrode parts 11 and 12.

The thermoelectric conversion module 21 is structured by arranging the wiring substrates 22A and 22B in parallel to each other, connecting the thermoelectric conversion elements 3 and 4 by silver joining material or the like to the electrode parts 11 and the electrode parts 12 and 23 between the wiring substrates 22A and 22B, putting into the case 5 made of stainless steel or the like in an airtight state (refer to FIG. 1), and maintaining vacuum state or decompressed state the inside of the case 5. As in the case of FIG. 1, the potential difference of the total of the electromotive force generated in the thermoelectric conversion elements 3 and 4 can be obtained between the outer wiring parts 25A and 25B, since the external higher-temperature channel 6 is connected to the side of the one of the wiring substrate (the first wiring substrate) 22A and the lower-temperature channel 7 is in contact with the side of the other wiring substrate (the second wiring substrate) 22B among the wiring substrates 22A and 22B.

Also in the thermoelectric conversion module 21 of the fourth embodiment, since the P-type thermoelectric conversion elements 3 having the higher strength support the load at the four corners so as to reduce the load on the N-type thermoelectric conversion elements 4 having the lower strength, the cracking and the like can be prevented. Since the length of the N-type thermoelectric conversion elements 4 having the larger thermal expansion coefficient is set to be shorter than the length of the P-type thermoelectric conversion elements 3, it is possible to prevent the module 21 from generating the stress by the thermal expansion difference between the thermoelectric conversion elements 3 and 4, and the N-type thermoelectric conversion elements 4 having the lower strength can be prevented from cracking or separation from the wiring substrates 22A and 22B and the like. Furthermore, by the electrically conductive spacers 15 (refer to FIG. 1) arranged between the first wiring substrate 2A and the N-type thermoelectric conversion elements 4 having the larger thermal expansion coefficient, it is possible to absorb dimensional change of the gap along with the thermal expansion and maintain the excellent electric conductivity.

Figure 8:
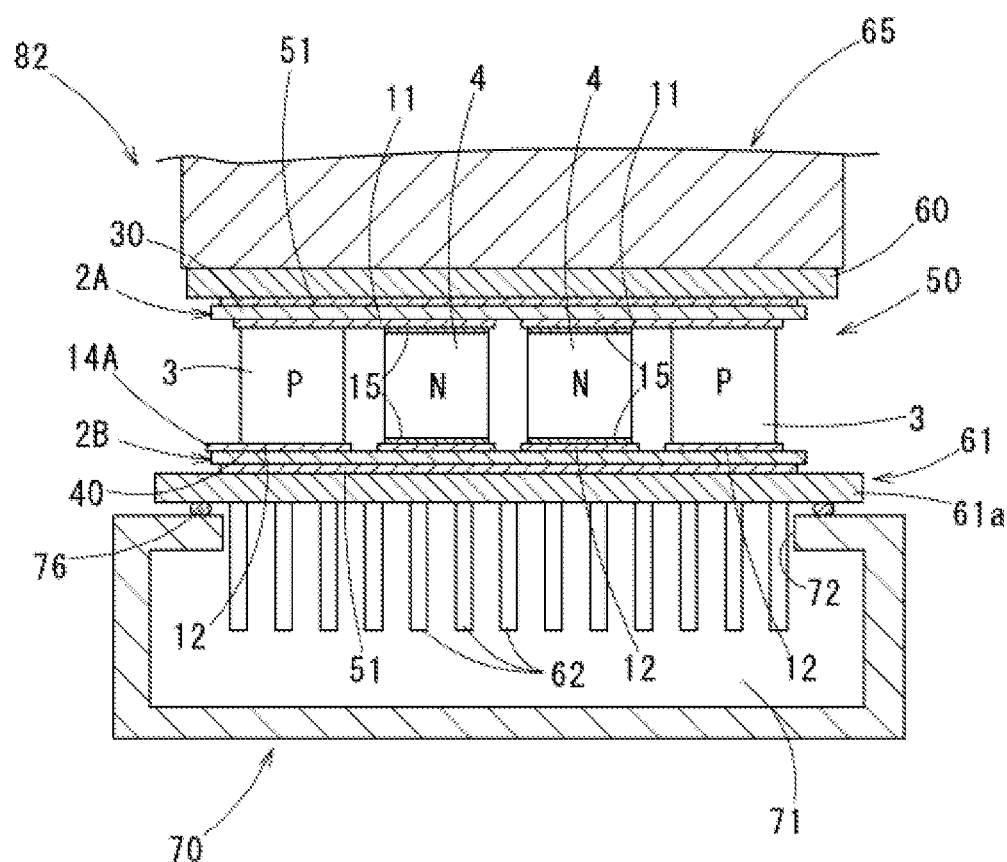
FIG. 8 It is a vertical sectional view showing an example of a thermoelectric conversion device structured by attaching a heat sink on a thermoelectric conversion module and installing it in a heat source.

As another aspect than the above embodiments, a structure in which a heat sink is fixed to the thermoelectric conversion module is acceptable as shown in FIG. 8.

In a thermoelectric conversion module 50, to the wiring substrates 2A and 2B at both ends thereof, heat transfer layers 51 made of aluminum or aluminum alloy (preferably aluminum with purity 99.99 mass % or higher) are joined to the surfaces of the ceramic substrates 30 at the back to the electrode parts 11 and 12. Thickness of the heat transfer layers 51 is preferably the same as the thickness of the electrode parts 11 and 12.

Heat sinks 60 and 61 are made of aluminum, aluminum alloy, copper, copper alloy or composite material (AlSiC) of aluminum silicon carbide made by impregnating a porous body of silicon carbide with aluminum or aluminum alloy, or the like. Fins 62 having pin-shape may be provided at the heat sinks; or the heat sinks may be a flat plate without fins 62. FIG. 8 shows the heat sink (an endothermic heat sink) 60 with flat plate shape provided at higher-temperature side and the heat sink (a radiation heat sink) 61 having the pin-like fins 62 provided at lower-temperature side. Thickness of the plate-like heat sink 60 and thickness of a top plate part 61a of the heat sink 61 having the pin-like fines 62 may be 0.5 mm to 8 mm, respectively.

A thermoelectric conversion device 82 is structured so that the plate-like heat sink 60 at the higher-temperature side is fixed to a heat source 65 such as a furnace wall so as to be in contact with; and the heat sink 61 having fins 62 at the lower-temperature side is fixed to to a liquid cooling cooler 70 in which cooling water or the like can flows. The liquid cooling cooler 70 has a channel 71 formed inside, is fixed in a state in which the top plate part 61a of the heat sink 61 is in contact with a periphery of an opening part 72 of a side wall, and is arranged in a state in which the fins 62 are inserted through the opening part 72 into the channel 71. A reference symbol 76 denotes a sealing part made of resin disposed between the liquid cooling cooler 70 and the top plate part 61a of the heat sink 61. The case 5 used in the embodiment shown in FIG. 1 is not used in FIG. 8.

The heat transfer layers 51 are joined to the heat sinks 60 and 61 by vacuum brazing using Al—Si based brazing material or the like, brazing using flux in nitrogen atmosphere, fluxless brazing using Al-based brazing material containing Mg, solid phase diffusion welding, or the like. Owing to this structure, it is possible to reduce thermal resistance between the thermoelectric conversion elements 3 and 4 and the heat source 65 and thermal resistance between the thermoelectric conversion elements 3 and 4 and the liquid cooling cooler 70.

EXAMPLES

P-type thermoelectric conversion elements having a square-pillar shape made of manganese silicide and N-type thermoelectric conversion elements having a square-pillar shape made of magnesium silicide were made; so that a bottom surface thereof was 4 mm×4 mm, length of the P-type thermoelectric conversion elements was 7 mm, 5 mm or 3.5 mm. The length of the N-type thermoelectric conversion elements was shorten so that a difference between the thermoelectric conversion elements was a dimension as shown in Table 2.

Thermoelectric conversion modules were made by combining the eight P-type thermoelectric conversion elements and the eight N-type thermoelectric conversion elements respectively. In wiring substrates, aluminum nitride having thickness 0.6 mm were used as ceramic substrates, and copper was used as electrode parts. Electrically conductive spacers (higher-temperature side spacers, lower-temperature side spacers) and thicknesses thereof were as shown in Table 2. In the table, "graphite sheet" was "PGS" an S-type graphite sheet made by Panasonic Corporation, "carbon nanofiber structure body" was carbon nanofiber non-woven fabric made by Nisshinbo Inc., "porous aluminum" was metal foam made of aluminum with 85% porosity rate, and "graphene sheet" was a graphene flower sheet made by Incubation Alliance, INC. "Silver coated hollow silica" was silver coated Silinax (a registered trademark) made by Nittetsu Mining Co., LTD. Silver coating was performed by electroless plating, with silver coating amount was silver 90%:hollow silica 10% (in mass ratio). "Nano silver particles" were silver nanocolloid A-1 made by Mitsubishi Materials Corporation. "Silver coated resin powder" was obtained by mixing silver coated resin powder with 10 μm diameter in which silver coat amount is silver-60%:resin-10% (in mass ratio) and core resin:acryl and a silver paste (SA-2024 made by Fujikura Ltd.) into a paste in 1:1 (in mass ratio) and sintering the paste by heating at 150° C. for 30 minutes.

Cycle tests for 48 hours were performed on the thermoelectric conversion modules so that raising/lowering temperature repeatedly at the higher-temperature side between 450° C. and 300° C. by an electric heater in a 30-minute cycle, and maintaining temperature at the lower-temperature side to 60° C. by a chiller (a cooler) in order to check power generation performance and a generation rate of cracks, separation and the like of the thermoelectric conversion elements.

The power generation performance was electric energy in the last cycle after 48 hours at the maximum temperature difference 390° C. The electric energy was a value obtained by measuring open circuit voltage and short circuit current of the thermoelectric conversion modules and multiplying a half of the open circuit voltage and a half of the short circuit current.

An element defect generation rate were evaluated after the cycle tests by a rate of the elements in which separation (including partial separation) of the elements and the electrode parts at the higher-temperature side and the lower-temperature side was generated, using an ultrasonic image measuring device (INSIGHT-300 made by Insight k.k.). If separation rate was 10% or higher, it was evaluated as defect.

These results were shown in Table 2.

TABLE 2

|  |  | LENGTH OF P-TYPE ELEMENT (mm) | DIFFERENCE BETWEEN ELEMENT LENGTH (μm) | TYPE OF SPACER AT HIGHER TEMPERATURE SIDE | SPACER THICKNESS AT HIGHER TEMPERATURE SIDE (μm) |
|---|---|---|---|---|---|
| TEST EXAMPLES | 1 | 7 | 25 | — | — |
|  | 2 | 7 | 30 | — | — |
|  | 3 | 7 | 300 | — | — |
|  | 4 | 7 | 500 | — | — |
|  | 5 | 7 | 550 | — | — |
|  | 6 | 7 | 0 | — | — |
|  | 7 | 7 | 25 | 4N—Al | 25 |
|  | 8 | 7 | 30 | 4N—Al | 30 |
|  | 9 | 7 | 300 | 4N—Al | 300 |
|  | 10 | 7 | 500 | 4N—Al | 500 |
|  | 11 | 7 | 550 | 4N—Al | 550 |
|  | 12 | 7 | 30 | 4N—Al | 15 |
|  | 13 | 7 | 300 | 4N—Al | 150 |
|  | 14 | 7 | 500 | 4N—Al | 250 |
|  | 15 | 7 | 300 | 4N—Al | 50 |
|  | 16 | 7 | 300 | 4N—Al | 250 |
|  | 17 | 5 | 150 | 4N—Al | 150 |

TABLE 2-continued

| | | | | | | |
|---|---|---|---|---|---|---|
| | 18 | 3.5 | 100 | 4N—Al | | 100 |
| | 19 | 7 | 300 | GRAFITE SHEET | | 100 |
| | 20 | 7 | 300 | CARBON NANOFIBER STRUCTURE BODY | | 100 |
| | 21 | 7 | 300 | POROUS ALUMINUM | | 100 |
| | 22 | 7 | 300 | GRAPHENE SHEET | | 100 |
| | 23 | 7 | 300 | SILVER-COATED HALLOW SILICA + NANOSILVER PARTICLE | | 100 |
| | 24 | 7 | 300 | 4N—Al | | 100 |
| | 25 | 7 | 300 | SILVER-COATED HALLOW SILICA | | 100 |
| | 26 | 7 | 300 | 4N—Al | | 100 |

| | | TYPE OF SPACER AT LOWER TEMPERATURE SIDE | SPACER THICKNESS AT LOWER TEMPERATURE SIDE (μm) | POWER GENERATION PERFORMANCE (mW) | ELEMENT DEFECT GENERATION RATE (%) |
|---|---|---|---|---|---|
| TEST EXAMPLES | 1 | SILVER-COATED RESIN POWDER | 25 | 344 | 37.5 |
| | 2 | SILVER-COATED RESIN POWDER | 30 | 648 | 11.7 |
| | 3 | SILVER-COATED RESIN POWDER | 300 | 824 | 11.7 |
| | 4 | SILVER-COATED RESIN POWDER | 500 | 800 | 6.3 |
| | 5 | SILVER-COATED RESIN POWDER | 550 | 680 | 3.1 |
| | 6 | — | — | 56 | 83.9 |
| | 7 | — | — | 272 | 53.1 |
| | 8 | — | — | 818 | 21.9 |
| | 9 | — | — | 784 | 12.5 |
| | 10 | — | — | 840 | 6.3 |
| | 11 | — | — | 502 | 15.6 |
| | 12 | SILVER-COATED RESIN POWDER | 15 | 512 | 43.8 |
| | 13 | SILVER-COATED RESIN POWDER | 150 | 704 | 21.9 |
| | 14 | SILVER-COATED RESIN POWDER | 250 | 770 | 15.6 |
| | 15 | SILVER-COATED RESIN POWDER | 250 | 720 | 18.8 |
| | 16 | SILVER-COATED RESIN POWDER | 50 | 738 | 18.8 |
| | 17 | — | 0 | 650 | 11.1 |
| | 18 | — | 0 | 648 | 15.6 |
| | 19 | SILVER-COATED RESIN POWDER | 200 | 528 | 28.1 |
| | 20 | SILVER-COATED RESIN POWDER | 200 | 456 | 21.9 |
| | 21 | SILVER-COATED RESIN POWDER | 200 | 408 | 34.4 |
| | 22 | SILVER-COATED RESIN POWDER | 200 | 424 | 34.3 |
| | 23 | SILVER-COATED HOLLOW SILICA + NANOSILVER PARTICLE | 100 | 512 | 28.1 |
| | 24 | SILVER-COATED HOLLOW SILICA + NANOSILVER PARTICLE | 100 | 584 | 18.8 |
| | 25 | SILVER-COATED HOLLOW SILICA | 100 | 458 | 31.3 |
| | 26 | SILVER-COATED HOLLOW SILICA | 100 | 496 | 21.9 |

As recognized from Table 2, when the thermoelectric conversion elements had the same length and the electrically conductive spacers were not disposed (Test Example 6), the element defect generation rate was high. It was recognized that the crack and separation of the the thermoelectric conversion elements were prevented by setting the thermoelectric conversion elements to have difference in the lengths therebetween and disposing the electrically conductive spacers: and that it was possible to obtain the thermoelectric conversion module having high power generation performance and low element defect generation rate if the difference of the lengths between the thermoelectric conversion elements were 30 μm or larger.

The present invention is not limited to the above-described embodiments and various modifications may be made without departing from the scope of the present invention.

In the embodiments, the electrode parts are formed on the surfaces of the ceramic substrates; and the electrically conductive spacers are disposed between the electrode parts and the thermoelectric conversion elements. However, it is acceptable to form the electrode parts on the ceramic substrates with the electrically conductive spacers therebetween and to join the thermoelectric conversion elements on the electrode parts.

When arranging the thermoelectric conversion elements in-plane, arrangements of a rectangle shape, a round shape or the like in plan-view may be acceptable other than the arrangement of a square shape in plan-view. In this case, it is sufficient to arrange the thermoelectric conversion elements having the higher strength at positions with appropriate space in a circumferential direction at the peripheral edge part. It is preferable to arrange them at even intervals.

The sectional shape of the above thermoelectric conversion elements are square: however, it may be formed into a rectangle shape, a round shape, or the like.

The above wiring substrates are in contact with the higher-temperature channel or the lower-temperature channel. However, it is not limited to a structure of channels, but it is sufficient to be contact with the heat source and cooling medium.

The thermal expansion coefficient of the N-type thermoelectric conversion elements are larger than that of that of the P-type thermoelectric conversion elements in the above elements. If the thermal expansion coefficient of the P-type thermoelectric conversion elements is larger than that of the N-type thermoelectric conversion elements, the P-type thermoelectric conversion elements are the first thermoelectric conversion elements: the length thereof may be set to be shorter than that of the N-type thermoelectric conversion elements (the second thermoelectric conversion elements); and the electrically conductive spacers may be disposed between the P-type thermoelectric conversion elements and the electrode parts.

INDUSTRIAL APPLICABILITY

It is possible to use a thermoelectric conversion module for a cooling device, a heating device, or a power generation device.

DESCRIPTION OF REFERENCE SYMBOLS 1, 10, 20 thermoelectric conversion module
2A, 2B wiring substrate
3 P-type thermoelectric conversion element
4 N-type thermoelectric conversion element
5 case
6 higher-temperature channel
7 lower-temperature channel
8 heat sink
8a endothermic fin
9 elastic member
11, 12 electrode part
13 inner wiring part
14A, 14B outer wiring part
15 electrically conductive spacer
21 thermoelectric conversion module
22A, 22B wiring substrate
23 electrode part
24 inner wiring part
25A, 25B outer wiring part
60, 61 heat sink
65 heat source
70 liquid cooling cooler
30 ceramic substrate
81, 82 thermoelectric conversion device

What is claimed is:

1. A thermoelectric conversion module comprising:
a pair of opposing wiring substrates;
and thermoelectric conversion elements connected between the wiring substrates by the wiring substrates, and further comprising a ceramic substrate and an electrode part which are provided at the respective wiring substrates,
wherein the electrode part is formed on a surface of the ceramic substrate and connected to the thermoelectric conversion elements;
a first thermoelectric conversion element with a larger thermal expansion coefficient and a second thermoelectric conversion element with a smaller thermal expansion coefficient, which compose the respective thermoelectric conversion elements;
an electrically conductive spacer interposed between the first thermoelectric conversion element and the wiring substrate which is a lower-temperature side in usage among the wiring substrates,
and an electrically conductive spacer interposed between the first thermoelectric conversion element and the wiring substrate which is a higher-temperature side in usage among the wiring substrates;
wherein a length of the first thermoelectric conversion element along a facing direction of the wiring substrates is smaller than a length of the second thermoelectric conversion element along the facing direction of the wiring substrates;
the electrically conductive spacer is arranged in each of spaces between two ends of the first thermoelectric conversion element and the wiring substrate;
the electrically conductive spacer between the first thermoelectric conversion element and the wiring substrate which is a lower-temperature side in usage among the wiring substrates is made of the bound body of resin powder coated with metal or the conductive resin;
and the electrically conductive spacer between the first thermoelectric conversion element and the wiring substrate which is a higher-temperature side in usage is made of either one of the bound body of inorganic powder coated with metal, the graphite, the porous metal, the structure body of carbon nanofiber, the graphene, and the foil or the plate made of aluminum of purity higher than 99.99 mass %.

2. The thermoelectric conversion module according to claim 1, wherein a difference between the lengths of the first thermoelectric conversion element and the second thermoelectric conversion element is set to be larger than a difference between the length of the first and second thermoelectric conversion elements in a highest temperature in an usage environment.

3. The thermoelectric conversion module according to claim 2, wherein the difference between the lengths is not smaller than 30 μm and not larger than 500 μm.

4. The thermoelectric conversion module according to claim 1, wherein a heat transfer layer made of aluminum of purity higher than 99.99 mass % is formed on a counter surface to a surface in which the electrode part is provided in the ceramic substrate of the wiring substrate.

5. A thermoelectric conversion module with heat sink comprising: the thermoelectric conversion module according to claim 4; an endothermic heat sink joined on the heat transfer layer of the one wiring substrate; and a radiation heat sink joined on the heat transfer layer of the other wiring substrate.

6. A thermoelectric conversion device comprising: the thermoelectric conversion module with heat sink according to claim 5; and a liquid cooling cooler fixed to the radiation heat sink.

* * * * *